United States Patent [19]

Ozaki

[11] Patent Number: 4,852,099
[45] Date of Patent: Jul. 25, 1989

[54] ERROR CORRECTION METHOD USING REED-SOLOMON CODE

[75] Inventor: Shinya Ozaki, Kanagawa, Japan

[73] Assignee: Sony Corporation, Tokyo, Japan

[21] Appl. No.: 151,624

[22] Filed: Feb. 2, 1988

[30] Foreign Application Priority Data

Feb. 6, 1987 [JP] Japan .................. 62-026082

[51] Int. Cl.$^4$ .............................. G06F 11/10
[52] U.S. Cl. .......................... 371/37; 371/39
[58] Field of Search .......... 371/37, 38, 39, 40

[56] References Cited

U.S. PATENT DOCUMENTS

| | | | |
|---|---|---|---|
| 4,476,562 | 10/1984 | Sako | 371/39 |
| 4,497,058 | 1/1985 | Sako | 371/37 |
| 4,546,474 | 10/1985 | Sako | 371/37 |
| 4,675,869 | 6/1987 | Driessen | 371/37 |
| 4,763,332 | 8/1988 | Glover | 371/37 |
| 4,796,110 | 1/1989 | Glas | 371/39 |

*Primary Examiner*—Michael R. Fleming
*Attorney, Agent, or Firm*—Lewis H. Eslinger; Jay H. Maioli

[57] ABSTRACT

In an error correction method using Reed-Solomon code when the error correction is performed by using the result of the multiplication of a syndrome and an error location, another syndrome is added to thereby form a new syndrome. By repetitively executing this procedure, the error vector is obtained by a small number of arithmetic operations relative to a known procedure, thereby performing error correction by the so-called erasure correction technique. Then, by calculating another error vector using the first calculated error vector, the number of arithmetic operation times can be even further reduced.

2 Claims, 5 Drawing Sheets

ERROR CORRECTION METHOD USING REED-SOLOMON CODE

BACKGROUND OF THE INVENTION

1. Field of the Invention

This invention relates generally to a method and apparatus for performing error correction on digital data using a Reed-Solomon code and, more particularly, to a method and apparatus for decoding a Reed-Solomon code wherein error symbols are corrected during decoding by error vectors obtained by a series of product sum arithmetic operations.

2. Description of the Background

One error correction code that is typically used in compact audio discs is the so-called CIRC correction code. CIRC is an acronym for Cross Interleave Reed-Solomon Code. In the case of the CIRC correction code, the encoding process of the (28, 24) Reed-Solomon code (C2 code) is performed for twenty-four data symbols, with each symbol consisting of 8 bits. In such typical audio applications each audio sample is 16 bits, which is formed of two symbols of 8 bits each. Thus, each 8-bit symbol is either the upper or lower side of an audio sample of one of the two channels of stereophonic audio data. These data symbols are in a first state of arrangement and, next, the data is rearranged from the first arrangement state to a second state of arrangement by an interleave operation. The encoding process of the (32, 28) Reed-Solomon code (C1 code) is then executed for the twenty-eight symbols that are now in the second arrangement state. When decoding the CIRC correction code, the C1 decoding is performed first, then the deinterleave is performed and, thereafter, the C2 decoding is performed.

There are already known various methods of decoding the CIRC correction code, and examples of such methods are disclosed in several U.S. patents, for example, U.S. Pat. Nos. 4,546,474; 4,476,562; and 4,497,058. On the other hand, there are also known various methods of decoding the Reed-Solomon code, and examples of such methods are disclosed in U.S. Pat. No. 4,476,562 and in U.S. patent application Ser. No. 767,783, assigned to the Assignee hereof.

According to the conventional decoding methods of the CIRC correction code, error processing up to and including double-error correction is executed in the C1 decoding in the first stage, and double-error correction is executed in the C2 decoding at the next stage by referring to pointer information that is derived from the C1 decoding.

One method of decoding the error correction code that has been proposed is the so-called erasure correction method, in which the location of the error symbol is indicated by pointer information and the necessary correction is performed on this error symbol. In the case of the above-mentioned C1 and C2 codes, detection and correction up to and including double errors (two symbols) can be respectively performed, however, if the error location is already known, then error correction up to and including quadruplex errors (four symbols) can be performed. Therefore, in order to raise the error correction capability, it has been preferred to perform the erasure correction method of decoding the error. Furthermore, the erasure correction method has been found to be particularly effective in correcting burst errors. On the other hand, in order to perform the erasure correction operation properly, the error locations must be preliminarily known from the pointer information and, moreover, the reliability of that pointer information must be relatively high.

According to the conventional coding method of the CIRC correction code, error correction up to and including double errors is executed in the C1 decoder. In such case, because there is a fear of the occurrence of triple errors, which of course could not be corrected, the C1 pointer is sent to the C2 decoder in the next stage, so that error correction is executed in the C2 decoder using the C1 pointer.

More specifically, in the case of the conventional CIRC correction code, as shown for example in FIG. 6, the series of the C1 code (C1 series) is formed by 32 symbols that are alternately included in two adjacent frames (one frame: 32 symbols). The series of the C2 code (C2 series) is formed by 28 symbols that are included in predetermined ones of 108 consecutive frames. Because the interleave length of the C1 series is shorter than that of the C2 series, when a fast-forward reproduction operation, such as queuing or review, is performed, a problem occurs in that some frames are dropped and the continuity of the frames is lost. That is, the C1 pointer is used to indicate the presence of errors in the one frame before and after the point of the discontinuity, however, the C1 pointer only indicates the absence of the errors in the other frame. On the other hand, the interleave length of the C2 series has 108 frames, and these 108 frames will include the point of discontinuity. Thus, this is also not the correct C2 series. Upon performing the erasure correction for the incorrect C2 series by use of the foregoing C1 pointer, the error correction will be incorrect.

To solve this problem of incomplete or incorrect error correction when performing error correction of the CIRC correction code, wherein the maximum error correcting capability is obtained by the erasure correction method, there has been proposed an error correction method whereby the C1 decoding and C2 decoding are executed twice in a specific order. That order might be, for example, C1 decoding, followed by C2 decoding, followed by C1 decoding, and followed by C2 decoding. In the first C2 decoding, erasure correction is performed using the C1 pointer obtained by the C1 decoding at the front stage and the erroneous correction that may occur at this erasure correction is prevented by the second C1 decoding and the C2 decoding, which are similar to the conventional method of decoding the CIRC correction code.

In using such an improved error correction method, it is necessary to perform the erasure correction in a short time period. In the case of the Reed Solomon code, generally, the erasure correction is performed by solving the following equation.

$$Sv = \sum_{j=1}^{n} X_j^v Y_j \tag{1}$$

where, $v = 0$ to $d-2$, n: the number of erasure symbols, $X_j$: jth error location, $Sv$: syndrome, $Y_j$: jth error vector, d: Hamming distance of the code.

For example, when four symbols are included, the syndromes are as follows:

$$S_0 = \sum_{j=1}^{4} Y_j \qquad (2)$$

$$S_1 = \sum_{j=1}^{4} X_j Y_j$$

$$S_2 = \sum_{j=1}^{4} X_j^2 Y_j$$

$$S_3 = \sum_{j=1}^{4} X_j^3 Y_j$$

The code length of the C2 code is 28. In the case where the error vector $Y_1$ exists in $\hat{W}_n$ with respect to the received symbols $\hat{W}_0$ to $\hat{W}_{27}$, then it is seen that $$\hat{W}_0 = W_0 \qquad (3)$$

$$\vdots$$

$$\hat{W}_{n-1} = W_{n-1}$$

$$\hat{W}_n = W_n + Y_1$$

$$\hat{W}_{n+1} = W_{n+1}$$

$$\vdots$$

$$\hat{W}_{27} = W_{27}$$

When it is assumed that the one error is included in the symbol $\hat{W}_n$, and it is further assumed that ($X_1 = \alpha^n$), then the syndromes can be written as:

$$S_0 = Y_1 \qquad (4)$$

$$S_1 = \alpha^n Y_1$$

$$S_2 = \alpha^{2n} Y_1$$

$$S_3 = \alpha^{3n} Y_1$$

where "j" in $X_j$ and $Y_j$ denotes the order assigned to the errors in the received data.

Similarly, if it is assumed that the errors exist in, for example, four symbols, such as $\hat{W}_0$, $\hat{W}_5$, $\hat{W}_{10}$, and $\hat{W}_{18}$, among the 28 symbols $\hat{W}_0$ to $\hat{W}_{27}$ that are received, that is:

$$\hat{W}_0 = W_0 + Y_1 \qquad (5)$$

$$\hat{W}_5 = W_5 + Y_2$$

$$\hat{W}_{10} = W_{10} + Y_3$$

$$\hat{W}_{18} = W_{18} + Y_4$$

and further assuming that: $X_1 = \alpha^0$, $X_2 = \alpha^5$, $X_3 = \alpha^{10}$, $X_4 = \alpha^{18}$ then when the errors exist in the four symbols, the following syndromes are derived.

$$S_0 = Y_1 + Y_2 + Y_3 + Y_4 \qquad (6)$$

$$S_1 = \alpha^0 Y_1 + \alpha^5 Y_2 + \alpha^{10} Y_3 + \alpha^{18} Y_4$$

$$S_2 = \alpha^0 Y_1 + \alpha^{10} Y_2 + \alpha^{20} Y_3 + \alpha^{36} Y_4$$

$$S_3 = \alpha^0 Y_1 + \alpha^{15} Y_2 + \alpha^{30} Y_3 + \alpha^{54} Y_4$$

When the error locations $X_1$ to $X_4$ are known from the pointer information, then the error vectors $Y_1$ to $Y_4$ are obtained as follows:

$$Y_4 = \frac{S_3 + (X_1 + X_2 + X_3) S_2 + (X_1 X_2 + X_2 X_3 + X_3 X_1) S_1 + X_1 X_2 X_3 S_0}{(X_4 + X_1)(X_4 + X_2)(X_3 + X_4)} \qquad (7)$$

$$Y_3 = \frac{S_3 + (X_1 + X_2 + X_4) S_2 + (X_1 X_2 + X_2 X_4 + X_4 X_1) S_1 + X_1 X_2 X_4 S_0}{(X_3 + X_1)(X_3 + X_2)(X_3 + X_4)}$$

$$Y_2 = \frac{S_3 + (X_1 + X_3 + X_4) S_2 + (X_1 X_3 + X_3 X_4 + X_4 X_1) S_1 + X_1 X_3 X_4 S_0}{(X_2 + X_1)(X_2 + X_3)(X_2 + X_4)}$$

$$Y_1 = \frac{S_3 + (X_2 + X_3 + X_4) S_2 + (X_2 X_3 + X_3 X_4 + X_4 X_2) S_1 + X_2 X_3 X_4 S_0}{(X_1 + X_2)(X_1 + X_3)(X_1 + X_4)}$$

According to the foregoing erasure correction method, there are a total of eighty-four calculation operations necessary to obtain the error vectors $Y_1$ to $Y_4$, more specifically, the eighty-four calculations are comprised of addition: 40 times, multiplication: 40 times, and division: 4 times.

When the foregoing processes are repetitively performed for all of the code series, there are problems that the number of arithmetic operations increases greatly, and the decoding time is correspondingly prolonged. One method of solving such problems has been disclosed in U.S. patent application Ser. No. 767,783. According to the erasure correction method disclosed therein the number of necessary arithmetic operation in the erasure correction for the product code can be effectively reduced, but such method is not so effective for cross interleave codes, such as the foregoing CIRC correction code.

OBJECTS AND SUMMARY OF THE INVENTION

It is, therefore, an object of the present invention to provide a method of decoding a Reed-Solomon code in which, even in the case of the cross interleave code, the number of times an arithmetic operation is performed for the erasure correction method can be reduced, as compared with that of the conventional decoding method, the decoding time can be reduced, and the necessary hardware can be simplified.

According to the present invention, this object is accomplished by a method of decoding a Reed-Solomon code for correcting errors by use of known error locations, whereby the errors are corrected by:

sequentially performing product sum arithmetic operations of syndromes $S\nu (\nu = 0$ to $n-1)$ and error locations $X_j$ ($j = 1$ to $n$) based on the following rule and setting the $i^{th}$ answer to $S\nu,i$, thereby obtaining $S_{0,n-1}$. More specifically, $$S_{\nu, i} = S_{\nu, i-1} X_i + S_{\nu+1, i-1} \qquad (8)$$

-continued $$(1 \leq i \leq n - 1)$$

where, $(Sv,_0 = Sv)$; and obtaining error vectors $Y_n$ by use of the $S_{0,n-1}$ syndrome, as follows:

$$Y_n = (S_{0,n-1}) / \prod_{k=1}^{n-1} (X_n + X_k) \quad (9)$$

According to the present invention, in the arithmetic operating equation (9) above in order to obtain the error vectors $Y_n$, the term of the numerator can be simplified compared with the same term in the conventional method and the number of arithmetic operation times for the erasure correction can be reduced. In this case, the process for arithmetically forming the term of the numerator can be executed by repeating the product sum arithmetic operations, so that the hardware can be simplified.

The number of arithmetic operation times can be even further reduced by correcting the syndromes from the error vectors and error locations that are used for the erasure correction and by sequentially reducing the number of erasure symbols.

The above and other objects and features of the present invention will become apparent from the following detailed description with reference to the accompanying drawings, in which like numerals represent the same or similar elements.

DETAILED DESCRIPTION OF PREFERRED EMBODIMENTS

Figure 1:
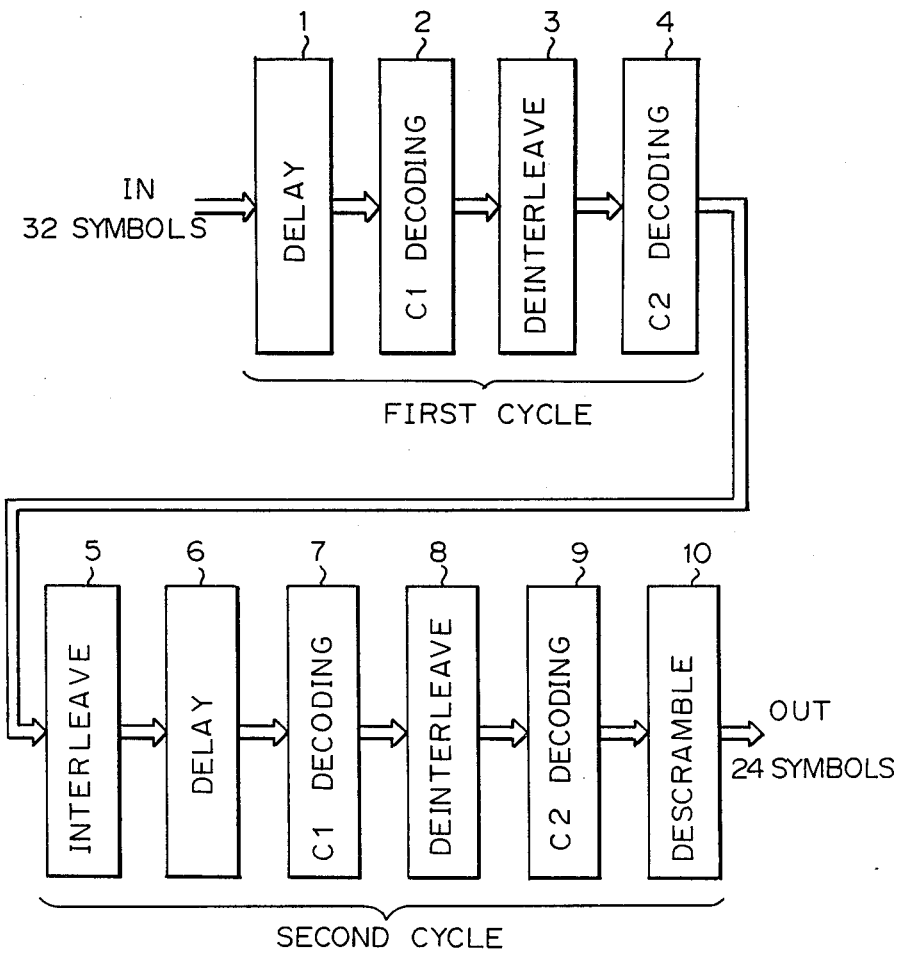
FIG. 1 is a block diagram showing a decoding procedure of a cross-interleave Reed-Solomon code used in explaining the present invention.

An embodiment of the present invention is described in detail hereinbelow in accordance with the following items:

A. Fundamental decoding method;
B. Erasure correcting method of a Reed-Solomon code; and
C. Decoding apparatus of a Reed-Solomon code A. Fundamental decoding method;

FIG. 1 is a block diagram showing a sequence for decoding a CIRC correction code to which the present invention can be applied.

The reproduced signals from a compact disc are EFM demodulated and the 32 symbols forming one frame, 16 bits for each of the two channels of audio data, are supplied to a time delay stage 1, in which only the even numbered symbols are delayed by an amount equal to one frame. Thus, the delay that was provided by the delay circuit on the encoder side (not shown) is effectively cancelled. The 32 symbols output from time delay 1 are supplied to a C1 decoder 2, in which the actual decoding of the (32, 28) Reed-Solomon code is executed. The error correction of up to two error symbols in the C1 series is performed in C1 decoder 2. When three or more errors are detected in C1 decoder 2, the C1 pointer indicative of the presence of the errors is set for all symbols in the C1 series.

The data and error pointers corrected by C1 decoder 2 are further processed in a deinterleave processing stage 3. Deinterleave processing stage 3 returns the data that was interleaved on the encoder side (not shown) to the original data arrangement, and the output of deinterleave processing stage 3 is supplied to a C2 decoder 4. In deinterleave stage 3 the C1 pointer of each symbol generated from C1 decoder 2 is deinterleaved in a manner similar to the deinterleave of the data. The delay process and deinterleave process could also be performed by the address control when data is read out of a RAM, in which case the C1 pointer is written into a memory area in a portion of the RAM and subjected to the same address control as the data. The erasure correction up to quadruplex errors (four errors) is executed in C2 decoder 4 by use of the C1 pointer. Upon completion of the erasure correction in C2 decoder 4, the C1 pointer is cleared and no pointer information is transferred to the second C1 decoding cycle, which will be described below. In this manner, because the C1 pointer of the first C2 decoding is not transferred, there is no requirement to use any of the RAM area to store the first C2 pointer. Thus, the required memory size is reduced by following the present invention.

In the second cycle, the data from C2 decoder 4 is supplied to an interleave processing stage 5 that returns the data to the same arrangement as it was when it was reproduced. The output data of interleave processing stage 5 is supplied to a second time delay stage 6, wherein a time delay of one frame (32 symbols) is imparted to the data. Because the data corrected by C1 decoder 2 and C2 decoder 4 is stored in the RAM, the operations in interleave processing stage 5 and two delay stage 6 can be performed by controlling the read addresses of this data in the RAM.

The data of 32 symbols (one frame) is supplied from time delay stage 6 to a second C1 decoder 7, wherein the decoding of the (32, 28) Reed-Solomon code is performed and the error correction up to and including double errors is executed. In C1 decoder 7, the C1 pointer is set not only in the case where three or more errors exist, but is also set in the case where double errors were corrected.

The output data is supplied from C1 decoder 7 to a deinterleave processing stage 8 where it is deinterleaved, so that 28 symbols data of are supplied from deinterleave processing stage 8 to a second C2 decoder 9, in which the decoding of the (28, 24) Reed-Solomon code is performed. In C2 decoder 9, error correction up to and including double errors is executed by reference to the number and states of the C1 pointers. The output data from C2 decoder 9 is supplied to a descramble processing stage 10 and processed in a manner opposite to the scrambling process performed on the encoder side (not shown). The decoding operations which are executed by second C1 decoder 7 and second C2 decoder 9 are carried out in a manner similar to those in the decoder of the CIRC correction code provided in a reproducing circuit of the compact disc playback unit.

As mentioned, the quadruplex erasure correction is performed in C2 decoder 4 by use of the C1 pointers generated in C1 decoder 2. Thus, the number of error symbols that can be corrected is increased, and the error correcting capability is improved relative to previously proposed techniques. Any mistaken, that is, incorrect, error correction which occurred when the erasure correction was performed is eliminated by the repeated execution of the C1 and C2 decodings, and the possibility of such incorrect error correction can be reduced.

Figure 2:
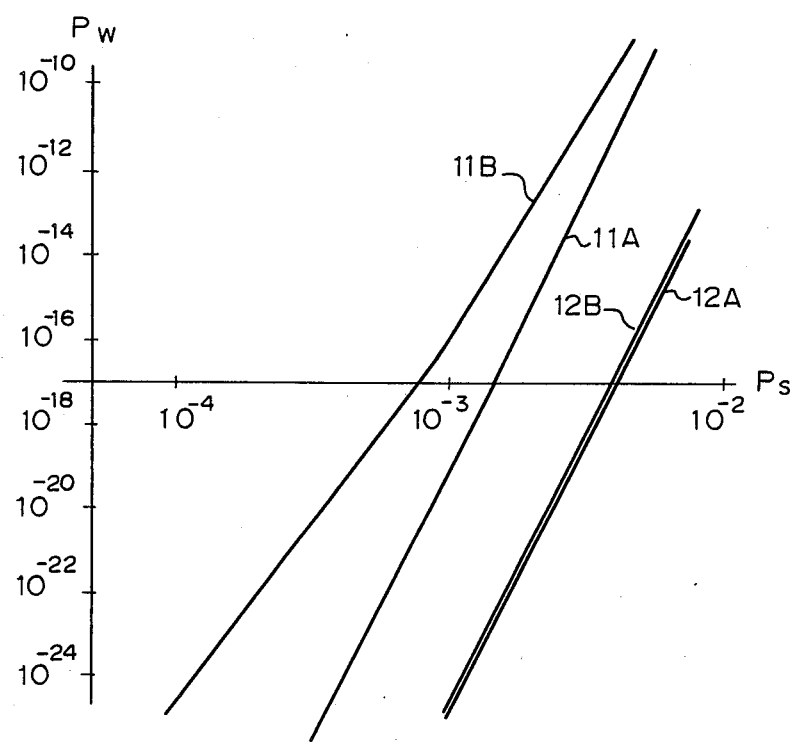
FIG. 2 is a graph comparing the error correcting capabilities of the present invention with previous proposals.

FIG. 2 is a graph representing a comparison of the error correcting capabilities of the embodiment of the present invention described above and of the conventional decoder of the CIRC correction code, which is used in existing compact disc playback equipment, for example.

The abscissa axis in FIG. 2 is the symbol error probability $P_s$ before correction and the ordinate axis is the word error probability $P_w$ before correction. In this embodiment, the probability in the case where the uncorrectable state occurs is shown at line 11A, whereas the probability in the case where the conventional decoder of the CIRC correction code enters the uncorrectable state is shown at line 11B. From a comparison between the probabilities represented by lines 11A and 11B, the error correcting capability of the embodiment of the present invention is seen to be improved over the known system. On the other hand, the probability where a wrong correction occurs in this embodiment of the present invention is shown at line 12A, whereas the probability where a wrong correction occurs in the conventional decoder is shown at line 12B. Thus, a comparison between lines 12A and 12B shows that the probability that the present inventive will make a wrong error correction is almost equal to or slightly better than that of the conventional decoder.

B. Erasure correcting method of a Reed-Solomon code:

In this example it is assumed that the present invention is applied to the erasure correction in C2 decoder 4 and that the Hamming distance of the C2 code is (d=5). The erasure correction according to this embodiment of the present invention is described hereinbelow.

The product sum arithmetic operations of the syndromes $S\nu(\nu=0$ to $n-1)$ and error locations $X_j (j=1$ to n) are sequentially performed on the basis of the following rule. The $i^{th}$ answer is set to $S\nu,i$, more specifically, $$S\nu, i = S\nu, i-1 X_i + S_{\nu+1, i-1} \quad (10)$$

$$(1 \leq i \leq n - 1)$$

where $(S\nu,0 = S\nu)$.

When obtaining $S_{0,n-1}$ by repetitively executing the above process, the error vectors $Y_n$ are obtained as follows:

$$Y_n = (S_{0,n-1}) / \prod_{k=1}^{n-1} (X_n + X_k) \quad (11)$$

As an example, a decoding method in the case of erasure correcting four error symbols (n=4) will be explained. First, $$\left. \begin{array}{l} S_{0,1} = S_0 X_1 + S_1 \\ S_{1,1} = S_1 X_1 + S_2 \\ S_{2,1} = S_2 X_1 + S_3 \end{array} \right\} \quad (12)$$

are obtained. Then, $$\left. \begin{array}{l} S_{0,2} = S_{0,1} X_2 + S_{1,1} \\ S_{1,2} = S_{1,1} X_2 + S_{2,1} \end{array} \right\} \quad (13)$$

are obtained. Then, $$S_{0,3} = S_{0,2} X_3 + S_{1,2} \quad (14)$$

is sequentially derived by product sum arithmetic operations. Finally, the error vector $$Y_4 = S_{0,3} / \prod_{k=1}^{3} (X_4 + X_k) \quad (15)$$

$$= \frac{S_{0,3}}{(X_4 + X_1)(X_4 + X_2)(X_4 + X_3)}$$

is obtained. In this manner, the error vector $Y_4$ can be derived by performing only a relatively small number of arithmetic operations compared with previously proposed procedures.

According to this invention, even in the case of obtaining the other error vectors, the number of arithmetic operations can be reduced by combining the following processes.

Namely, the original syndromes are corrected to the syndromes at occurrence of triple errors by use of the error vector $Y_4$, as follows:

$$S_0 + Y_4 \longrightarrow S_0 \quad (16)$$

$$S_1 + X_4 Y_4 \longrightarrow S_1$$

$$S_2 + X_4^2 Y_4 \longrightarrow S_2$$

The following calculations are executed with these corrected syndromes, thereby obtaining the error vector $Y_3$.

$$\left. \begin{array}{l} S_{0,1} = S_0 X_1 + S_1 \\ S_{1,1} = S_1 X_1 + S_2 \end{array} \right\} \quad (17)$$

are obtained, then, $$S_{0,2} = S_{0,1} X_2 + S_{1,1} \quad (18)$$

is obtained. Thus, $$Y_3 = \frac{S_{0,2}}{(X_3 + X_1)(X_3 + X_2)} \quad (19)$$

is derived.

In a manner similar to the above, the error vectors $Y_2$ and $Y_1$ are obtained by correcting the syndromes.

$$S_0 + Y_3 \longrightarrow S_0 \quad (20)$$

$$S_1 + X_3 Y_3 \longrightarrow S_1$$

$$S_{0,1} = S_0 X_1 + S_1$$
$$Y_2 = S_{0,1}/(X_2 + X_1)$$

On the other hand, $$S_0 + Y_2 \longrightarrow S_0 \quad (21)$$

$$Y_1 = S_0$$

are obtained.

The number of times an arithmetic operation is necessary for the foregoing decoding method can be reduced to a total of 42 times; more specifically, addition: 22 times, multiplication: 17 times, and division: 3 times. Thus, the number of times an arithmetic operation is required to be performed can be substantially reduced, as compared with the conventional decoding method.

The following theorem is used to obtain the foregoing error vectors $Y_n$:

Theorem:

$$S_\nu = \sum_{j=1}^{n} X_j^\nu Y_j$$

and $X_i$ are obtained, where $S_{\nu,i}$ are sequentially calculated by the algorithms of $$S_{\nu, 0} = S_\nu \quad (\nu = 0 \text{ to } n - 1) \quad (22)$$

$$S_{\nu, i} = S_{\nu, i-1} X_i + S_{\nu+1, i-1}$$

$$(i = 1 \text{ to } n - 1, \nu = 0 \text{ to } n - 1 - i),$$

$$S_{\nu, i} = \sum_{j=i+1}^{n} X_j^\nu Y_j \prod_{k=1}^{i} (X_k + X_j)$$

Proof:

when $i = 1$, (23)

the left side $= S_{\nu, 1} = S_{\nu, 0} X_1 + S_{\nu+1, 0}$ $$\sum_{j=1}^{n} X_j^\nu Y_j X_1 + \sum_{j=1}^{n} X_j^{\nu+1} Y_j$$

$$\sum_{j=1}^{n} X_j^\nu Y_j (X_1 + X_j)$$

$$\sum_{j=2}^{n} X_j^\nu Y_j (X_1 + X_j)$$

and the right side $= \sum_{j=2}^{n} X_j^\nu Y_j \prod_{k=1}^{1} (X_k + X_j) \quad (24)$ $$\sum_{j=2}^{n} X_j^\nu Y_j (X_l + X_j)$$

Therefore, the left side equals the right side.

Now, assuming that equations (23) and (24) are correct for ($i=1$), then when ($i=i+1$):

$$S_{\nu, i+1} = S_{\nu, 1} X_{i+1} + S_{\nu+1, i} \quad (25)$$

$$= X_{i+1} \sum_{j=i+1}^{n} X_j^\nu Y_j \prod_{k=1}^{i} (X_k + X_j)$$

$$+ \sum_{j=i+1}^{n} X_j^{\nu+1} Y_j \prod_{k=1}^{i} (X_k + X_j)$$

$$= \sum_{j=i+1}^{n} X_j^\nu Y_j (X_{i+1} + X_j) \prod_{k=1}^{i} (X_k + X_j)$$

$$= \sum_{j=i+2}^{n} X_j^\nu Y_j (X_{i+1} + X_j) \prod_{k=1}^{i} (X_k + X_j)$$

$$= \sum_{j=i+2}^{n} X_j^\nu Y_j \prod_{k=1}^{i+1} (X_k + X_j)$$

When $\nu=0$ and $i=n-1$ are substituted in equation (22) above, $$S_{0, n-1} = \sum_{j=n}^{n} X_j^0 Y_j \prod_{k=1}^{n-1} (X_k + X_j) \quad (26)$$

$$= Y_n \prod_{k=1}^{n-1} (X_k + X_n)$$

Therefore, $$Y_n = \frac{S_{0, n-1}}{\prod_{k=1}^{n-1} (X_k + X_n)} \quad (27)$$

and the error vectors $Y_n$ can be obtained in this manner.

Figure 3:
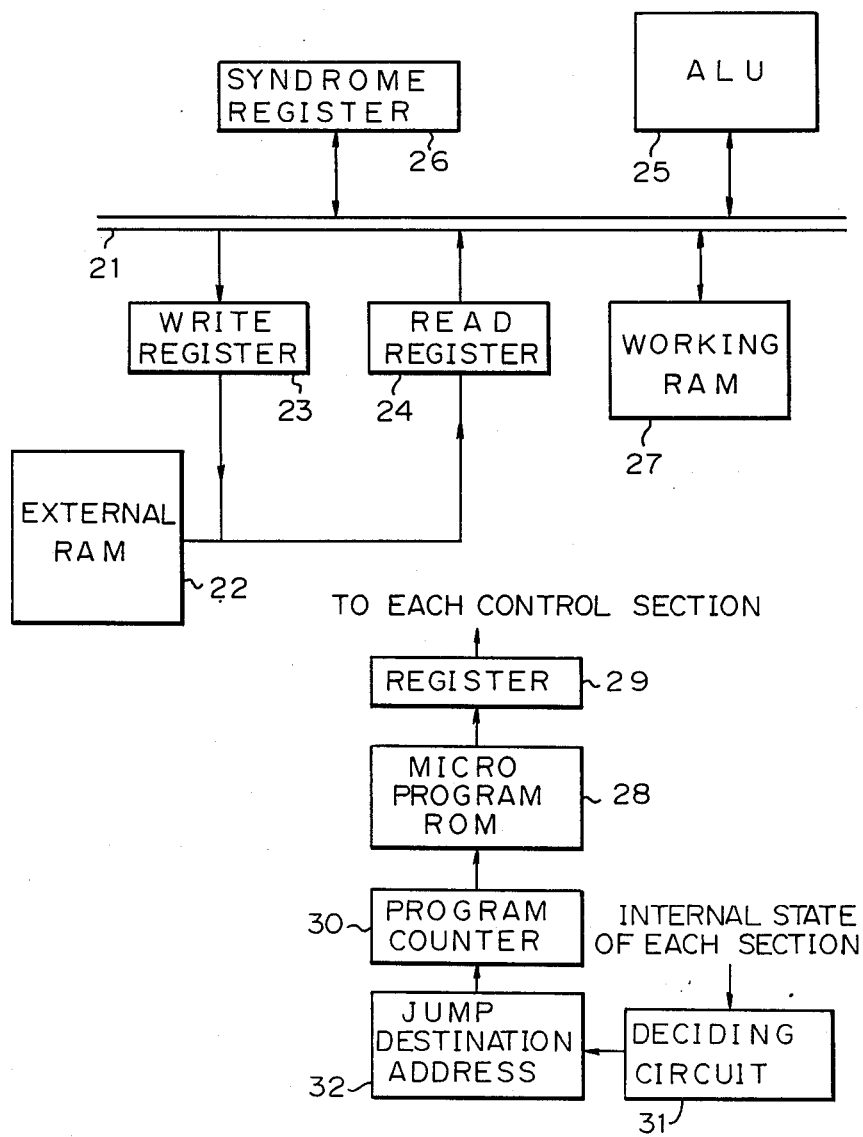
FIG. 3 is a block diagram of an embodiment of a decoder for a Reed-Solomon code according to the present invention.

C. Decoding apparatus of a Reed-Solomon code:

An embodiment according to the present invention of the decoder of the Reed-Solomon code is shown in FIG. 3, in which an external RAM 22 is connected to an internal bus 21 through a write register 23 and a read register 24. An arithmetic operating logic unit (ALU) 25, a syndrome register 26, and a working RAM 27 are also connected to internal data bus 21. The decoding data reproduced from a compact disc or the like is stored in external RAM 22.

The decoder of FIG. 3 can be configured as a microprogrammed (microprocessor) system, and a microcommand is read out of a microprogram ROM 28 that gives a control signal to each control section through a buffer register 29. This control signal affects all of the functional blocks of the decoder. A program counter 30 is provided in conjunction with the microprogram ROM 28, and the internal state of each section or functional block of the decoder is supplied to a deciding circuit 31. A jump destination address generator 32 generates a jump destination address fed to the program counter 30 in response to an output signal from deciding circuit 31.

In the decoder shown in FIG. 3, the syndromes are calculated by the ALU 25 based on the data read out from external RAM 22, and these syndromes are stored into syndrome register 26. ALU 25 can perform not only the arithmetic operations required of the syndromes but also the product-sum arithmetic operations that occur in the erasure correcting process. On the other hand, the error locations obtained by ALU 25 and the results ($S\nu_{,i}$ and the like) of the calculations during the calculating processes are stored in working RAM 27.

Figure 4:
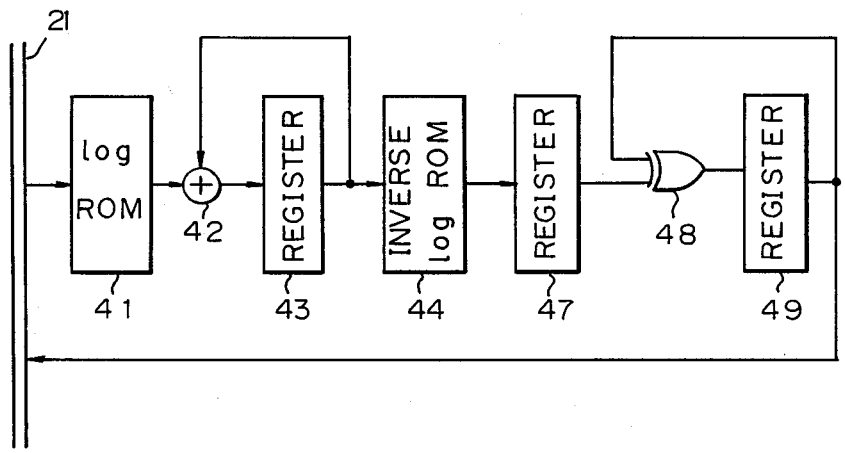
FIG. 4 is a block diagram of one embodiment of the main section of a decoder for a Reed-Solomon code according to the present invention.

FIG. 4 is an embodiment of an ALU that can perform the erasure correction procedure that is provided in ALU 25, in the embodiment of FIG. 4. Because the erasure correcting process of the present invention is performed by product-sum arithmetic operations, the ALU of FIG. 4 has a multiplying section and an adding section in cascade connection.

In FIG. 4, a log ROM 41 is connected to the internal data bus 21 and outputs an index i (eight bits) when the elements $\alpha^i$ (eight bit data) on the Galois Field are supplied as an address input. The output of log ROM 41 is supplied to an adder 42, whose output in turn is supplied to a register 43. The output of register 43 is supplied to an inverse log ROM 44 and also is fed back to the other input of adder 42. Adder 42 executes the addition of the index, namely, the multiplication of $\alpha$. When the index i is supplied as the address input to inverse log ROM 44, the output $\alpha^i$ is produced and is stored in a register 47, whose output is supplied to an exclusive OR circuit 48, which functions as a modulo 2 adder. An output of exclusive OR circuit 48 is supplied to a register 49, whose output in turn is fed back to another input of exclusive OR circuit 48 and is also fed onto internal data bus 21. Addition on the Galois Field is performed by exclusive OR circuit 48 in accordance with known techniques.

Figure 5:
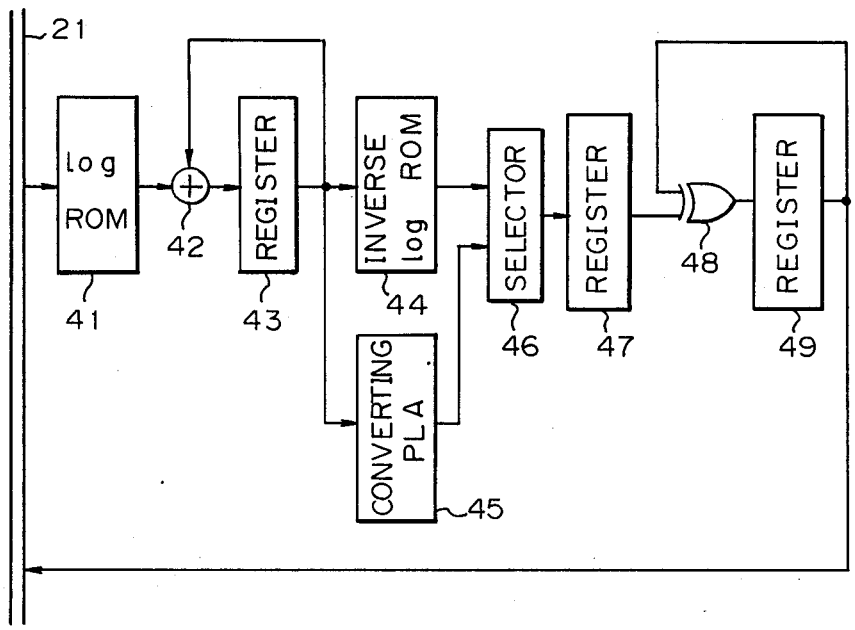
FIG. 5 is a block diagram of another embodiment of the main section of a decoder for a Reed-Solomon code according to the present invention.
Figure 6:
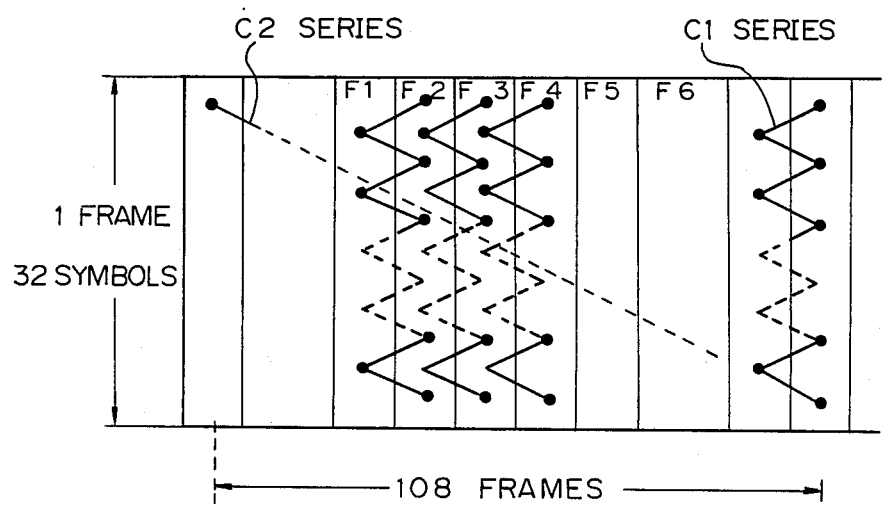
FIG. 6 is a diagram for explaining a code series of a cross-interleave Reed-Solomon code, as known in the prior art.

FIG. 5 is another embodiment according to the present invention of an ALU that can be used for both erasure correction and for error detection/correction. As in the embodiment of FIG. 4, a product sum arithmetic operating circuit is formed by a log ROM 41, an adder 42, a register 43, an inverse log ROM 44, a register 47, an exclusive OR circuit 48, and a register 49, however, converting PLA 45 is needed to solve the error location equation in the double error correction of the Reed-Solomon code. Converting PLA 45 is a programmable logic array that converts an input bit pattern into another corresponding bit pattern. Therefore, inverse log ROM 44 and converting PLA 45 are connected to the output of register 43, and outputs of both ROM 44 and PLA 45 and supplied to a selector 46. Selector 46 selects the output of inverse log ROM 44 when the product sum arithmetic operations of the erasure correction or the like are executed, and selector 46 selects the output of converting PLA 45 in those predetermined steps when error locations are obtained during the error correction.

The present invention can be also applied to another Reed-Solomon code having a Hamming distance other than (d=5) in a manner similar to the above.

According to the present invention, when the erasure correction is performed, the term of the numerator in the arithmetic operation used to obtain the error vectors can be obtained by repetitively executing product sum arithmetic operations. The number of times the arithmetic operations must be performed can be substantially reduced in relation to the conventional erasure correction method.

On the other hand, by sequentially correcting the syndromes using the error vectors and error locations and by reducing the number of erasure correcting symbols, the number of times the arithmetic operations are performed can even be further reduced. Thus, the decoding time can be reduced and the hardware can be simplified.

The above description is given on a single preferred embodiment of the present invention, but it will be apparent that many modifications and variations could be effected by one skilled in the art without departing from the spirit or scope of the novel concepts of the invention, which should be determined by the appended claims.

What is claimed is:

1. An error-correction method for use in decoding Reed-Solomon code that corrects errors in data by use of known error locations, whereby respective error symbols are corrected by use of n error vectors obtained by a series of steps comprising:

(A) performing product sum arithmetic operations of syndromes $S\nu(\nu=0$ to $n-1)$ and error locations $X_j$ ($j=1$ to n) on the basis of:

$$S\nu_{,i} = S\nu_{,i-1}X_i + S\nu_{+1,i-1} \; (1 \leq i \leq n-1: \text{n is the number of error symbols})$$

where, $(S\nu_{,0} = S\nu)$ for sequentially obtaining an $i^{th}$ answer $S\nu_{,i}$, and for finally obtaining $S_{0,n-1}$; and (B) obtaining error vectors $Y_n$ by performing the following arithmetic operation by use of said $S_{0,n-1}$, $$Y_n = \frac{S_{0,n-1}}{\prod\limits_{k=1}^{n-1}(X_n + X_k)}.$$

2. An error correction method for use in decoding Reed-Solomon code that corrects errors by use of known error locations, whereby respective error symbols are corrected by use of n error vectors obtained by repetitively executing a series of steps comprising:

(A) performing product sum arithmetic operations of syndromes $S\nu(\nu=0$ to $n-1)$ and error locations $X_j$ ($j=1$ to n) on the basis:

$$S\nu_{,i} = S\nu_{,i-1}X_i + S\nu_{+1,i-l} \; (1 \leq i \leq n-1: \text{and n is the number of error symbols})$$

where, $(S\nu_{,0} = S)$; for sequentially obtaining an $i^{th}$ answer $S\nu_{,i}$, and for finally obtaining $S_{0,n-1}$;

(B) obtaining error vectors $Y_n$ by performing the following arithmetic operation by use of said $S_{0,n-1}$ derived in the preceding step, $$Y_n = \frac{S_{0,n-1}}{\prod\limits_{k=1}^{n-1}(X_n + X_k)}$$

thereby correcting one-symbol errors;

(C) correcting said syndromes $S\nu(\nu=0$ to $n-2)$ by use of said error vectors $Y_n$, thereby producing syndromes in the case of $(n-1)$-multiple errors; and (D) thereafter, applying said equation for $S\nu_{,i}$ to obtain the next error vector $Y_{n-1}$.

* * * * *